United States Patent [19]

Kobayashi et al.

[11] Patent Number: 6,118,441

[45] Date of Patent: Sep. 12, 2000

[54] DISPLAY DEVICE FOR AUDIO SYSTEM INCLUDING RADIO TUNER

[75] Inventors: Kazutomo Kobayashi; Eiichi Iwasa; Masaru Tomita, all of Tokyo, Japan

[73] Assignee: Clarion Co., Ltd., Tokyo, Japan

[21] Appl. No.: 09/175,772

[22] Filed: Oct. 20, 1998

[30] Foreign Application Priority Data

Oct. 20, 1997 [JP] Japan ..................................... 9-303318

[51] Int. Cl.⁷ ..................................................... G06F 3/14
[52] U.S. Cl. ........................... 345/326; 345/302; 345/158; 345/339; 345/333; 345/334; 701/36; 434/29
[58] Field of Search ..................... 345/158, 302, 345/326, 339, 333, 334, 970; 701/36; 434/29

[56] References Cited

U.S. PATENT DOCUMENTS

| 5,193,009 | 3/1993 | Park ........................................ 386/108 |
| 5,275,565 | 1/1994 | Moncrief ................................... 434/29 |
| 5,745,095 | 4/1998 | Parchem et al. ......................... 345/114 |
| 5,790,958 | 8/1998 | McCoy et al. ........................... 455/557 |
| 5,801,485 | 9/1998 | Veen et al. ............................... 313/495 |
| 6,047,099 | 4/2000 | Oku ............................................ 386/52 |

FOREIGN PATENT DOCUMENTS

| 0 375 128 A2 | 6/1990 | European Pat. Off. . |
| 0 434 050 A2 | 6/1991 | European Pat. Off. . |

OTHER PUBLICATIONS

European Search Report dated Feb. 25, 1999.

*Primary Examiner*—Raymond J. Bayerl
*Assistant Examiner*—Thomas T. Nguyen
*Attorney, Agent, or Firm*—McGinn & Gibb, P.C.

[57] ABSTRACT

A display device is provided with a center unit 10 having a center display unit 12, a slave unit 20 having a slave display unit 21 and a communication line for communicatively connecting the center unit 10 and the slave unit 20. When the center control microcomputer 15 of the center unit 10 detects a predetermined operation through a key operating unit 14, the center control microcomputer 15 and the slave control microcomputer 24 make two of the center display unit 12 and the slave display unit 21 provide a linking display as if these display units operate as one display unit.

11 Claims, 6 Drawing Sheets

FIG. 8

| FIRST IDENTIFICATION CODE | IMAGE CODE |
|---|---|

FIG. 9

| SECOND IDENTIFICATION CODE | VARIABLE IMAGE DATA | SECOND IDENTIFICATION CODE | VARIABLE IMAGE DATA |
|---|---|---|---|

DISPLAY DEVICE FOR AUDIO SYSTEM INCLUDING RADIO TUNER

BACKGROUND OF THE INVENTION

The present invention relates to a display device for a car audio unit, comprises, for example, a center unit having a center display unit, a slave unit having a slave display unit and a communication line for connecting the center and slave units for communicating purposes, so that various items of information are displayed in these center and slave display units.

Heretofore, a space for use in containing such a car audio unit is generally 2DIN in size (1DIN size=about 180×50 mm) and when a center unit of 2DIN is used, the display size of the center display unit provided in the center unit is large and an image display of various contents can be made accordingly.

When a center unit of 1DIN in size is used, however, because the size of the center display unit becomes small correspondingly, a situation in which the display size limits the display contents is likely to occur.

In order to cope with that situation, it is taken into consideration that a greater display space is secured by additionally providing and connecting a slave unit of 1DIN to a center unit of 1DIN so as to increase the number of display units in the center and slave units.

However, even though such a greater display space is realized in the aforesaid conventional display device by additionally providing and connecting a slave unit of 1DIN to a center unit of 1DIN and by combining the display units of the center and slave units together, there still exist problems of causing the display units to display different display contents or causing the display units to display duplicated contents in that, for example, while a radio frequency is being display in the center display unit of the center unit, an equalizer space is displayed in the slave display unit of the slave unit.

SUMMARY OF THE INVENTION

An object of the present invention made in view of the foregoing problems is to provide a display device for having display contents of a display unit in a center unit linked with display contents of a display unit in a slave unit so that these display units are employed as if they are used as one display unit for making an image content display.

In order to accomplish the object above, a display device according to the present invention comprising a center unit having a first display unit, a slave unit having a second display unit and a communication line for communicatively connecting the center unit and the slave unit, in that the center unit comprises: display message transmitting means for preparing a display message including regular image data indicating a form of displaying the linkage between the display images of the first display and second display units corresponding a predetermined operation on detecting the predetermined operation and for transmitting the display message to the slave unit, center variable display detection means for detecting variable display data including variable image data indicating an operating condition from the communication line and center control means for displaying a regular image linked with the second display unit in the first display unit according to the regular image data contained in the display message when the display message is transmitted by the display message transmitting means and simultaneously causing the regular image together with a variable image linked with the second display unit to be displayed in the first display unit according to the variable image data included in the variable display data and the regular image data when the variable display data is detected by the center variable display detection means; and the slave unit comprises: display message receiving means for receiving the display message from the center unit, slave variable display detection means for detecting the variable display data including the variable image data indicating the operating condition from the communication line and slave control means for displaying the regular image linked with the first display unit in the second display unit according to the regular image data contained in the display message when the display message is received by the display message receiving means and simultaneously causing the regular image together with the variable image linked with the second display unit to be displayed in the second display unit according to the variable image data included in the variable display data and the regular image data when the variable display data is detected by the slave variable display detection means.

The aforesaid center unit is a unit which is, for example, 1DIN in size and has a display unit and the slave unit communicatively connected to the center unit via the communication line is also equivalent to a unit which is, for example, 1DIN in size and has a display unit.

On detecting the predetermined operation, the aforesaid display message transmitting means prepares the display message containing the regular image data indicating the form of displaying the linking display corresponding to the predetermined operation and transmits the display message to the slave unit. Incidentally, the predetermined operation is equivalent to a key operation for quickening the start of a linking display function performed by a key operating unit provided in, for example, the center unit.

The aforesaid linking display is equivalent to the linked image display made in two of the first and second display units as if it is made in one display unit; for example, an interlocking display utilized for a space display, a list display utilized for a title display, an operation assisting display utilized for a title input display or the like.

The aforesaid regular image data is equivalent to a display format for displaying the linking display such as the interlocking display, the list display, the operation assisting display and the like.

The aforesaid center variable display detection means is used for detecting the variable display data including the variable image data indicating the operating condition from the communication line.

The aforesaid variable image data is equivalent to data indicating the operating condition of the unit connected to the communication line, the equalizer unit, the CD changer unit or the like and to, for example, indicator data relating to the spectrum analyzer display, title name data relating to the title display and the like.

The aforesaid center control means is equivalent to, for example, a center control microcomputer for displaying the regular image linked with the second display unit in the first display unit according to the regular image data contained in the display message when the display message is transmitted by the display message transmitting means and simultaneously causing the regular image together with the variable image linked with the second display unit to be displayed in the first display unit according to the variable image data included in the variable display data and the regular image data when the variable display data is detected by the center variable display detection means.

In this case, the display message transmitting means, the center variable display detection means and the center control means are equivalent to, for example, center control microcomputers of the center unit.

The aforesaid display message receiving means is used for receiving the display message from the center unit.

The aforesaid slave variable display detection means is used for detecting the variable display data including the variable image data indicating the operation condition from the communication line.

The aforesaid slave control means is used for displaying the regular image linked with the first display unit in the second display unit according to the regular image data contained in the display message when the display message is received by the display message receiving means and simultaneously causing the regular image together with the variable image linked with the first display unit to be displayed in the second display unit according to the variable image data included in the variable display data and the regular image data when the variable display data is detected by the slave variable display detection means.

In this case, the display message receiving means, the slave variable display detection means and the slave control means are equivalent to, for example, slave control microcomputers of the slave unit.

On acquiring the display message in the center and slave units and receiving the variable display data in the center and slave units via the communication line, the display device according to the present invention makes the linked display in the first and second display units of the center and slave units according to the regular image data included in the display message and the variable image data included in the variable display data and causes the regular image indicating the linked display and the variable image indicating the operation condition in these first and second display units, whereby the image display of the display contents can be made in the two display units of the respective center and slave units as if it is made in one display unit and hence multifarious display contents can be provided for users by means of display spaces.

BRIEF DESCRIPTION OF THE DRAWINGS

FIG. 8 is a diagram illustrating the data format of a request message transmitted from a center control microcomputer to a slave control microcomputer in the linking display process in this mode of the invention; and FIG. 9 is a diagram illustrating the data format of variable display data obtainable from each connection unit such as a CD changer unit and an EQ unit in the linking display process in this mode of the invention.

DETAILED DESCRIPTION OF THE PREFERRED EMBODIMENTS

Figure 1:
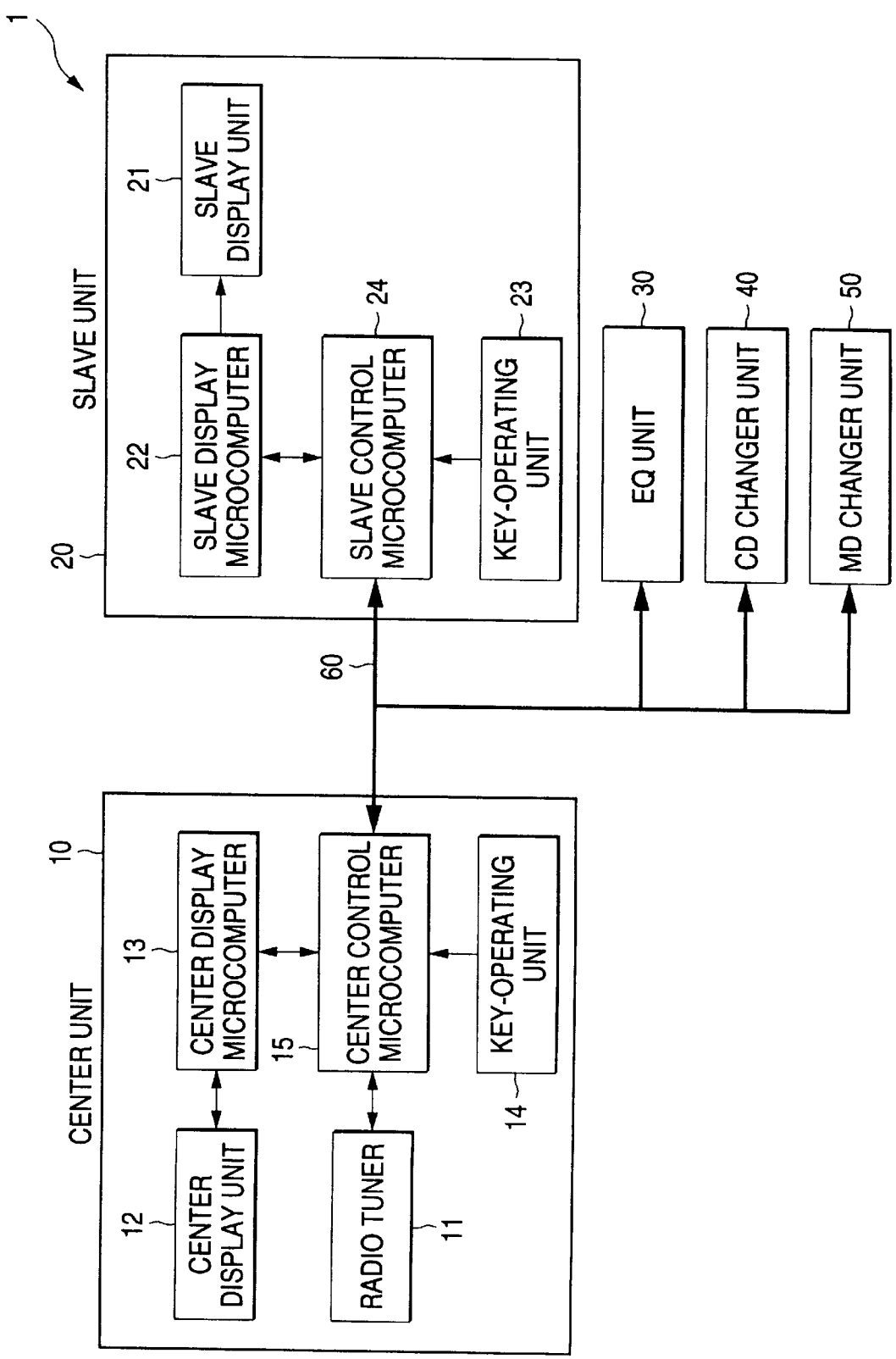
FIG. 1 is a block diagram showing a schematic configuration inside a car audio system in a display device according to the present invention.
Figure 2:
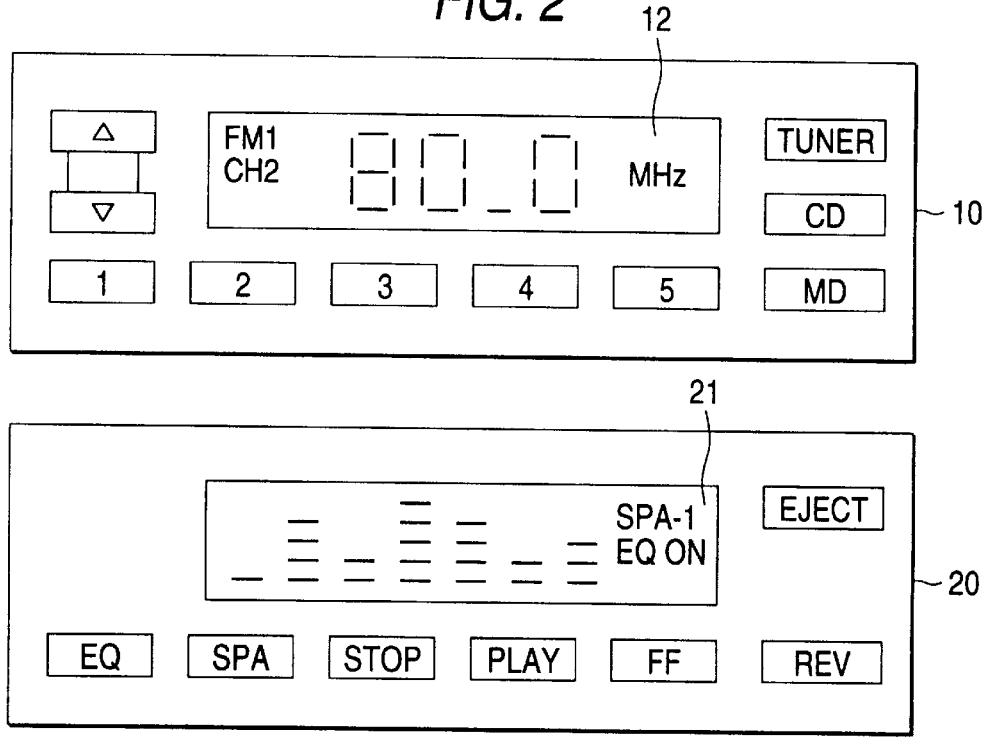
FIG. 2 is an elevational view of a center and a slave unit embodying the present invention.

A description will subsequently be given of an embodiment of a car audio system in a display device according to the present invention with reference to the drawings. FIG. 1 is a block diagram showing a schematic configuration inside a car audio system in a display device according to the present invention; and FIG. 2, an elevational view of a center and a slave unit embodying the present invention.

A car audio system 1 of FIG. 1 comprises a center unit 10 functioning as a radio tuner and as a display, a slave unit 20 functioning as a display, an equalizer unit (EQ unit) 30 functioning as an equalizer, a CD changer unit 40 for containing a plurality of CDs, the CD changer unit functioning as what plays back the CDs, an MD changer unit 50 for containing a plurality of MDs, the MD changer unit functioning as what plays back the MDs, and a communication line 60 for communicatively connecting the center unit 10, the slave unit 20, the equalizer unit 30, the CD changer unit 40 and the MD changer unit 50.

The center unit 10 comprises a radio tuner unit 11 for managing the radio tuner function, a center display unit 12 for displaying various items of information on images, a center display microcomputer 13 for controlling the center display unit 12, a key operating unit 14 for inputting various commands, and a center control microcomputer 15 for controlling the whole center unit 10.

The slave unit 20 comprises a slave display unit 21 for displaying various items of information on images, a slave display microcomputer 22 for controlling the slave display unit 21, a key operating unit 23 for inputting various commands, and a slave control microcomputer. 24 for controlling the whole slave unit 20.

The center display unit 12 of the center unit 10 and the slave display unit 21 of the slave unit 20, though these are capable of normal individual display as before, may have a linking display function for making a display by letting the center display unit 12 cooperate with the slave display unit 21 in response to the predetermined operation performed by the key operating unit 14 of the center unit 10.

The linking display function in both center and slave display units 12, 21 will subsequently be described.

This linking display function means that various display contents are displayed in the center and slave display units 12, 21 by utilizing these two center and slave display units 12, 21 as one display unit. As embodiments of the function, there are, for example, an interlocking display used for a space display, a list display used for a title display, an operation assisting display used for a title input display and so forth.

Figure 3:
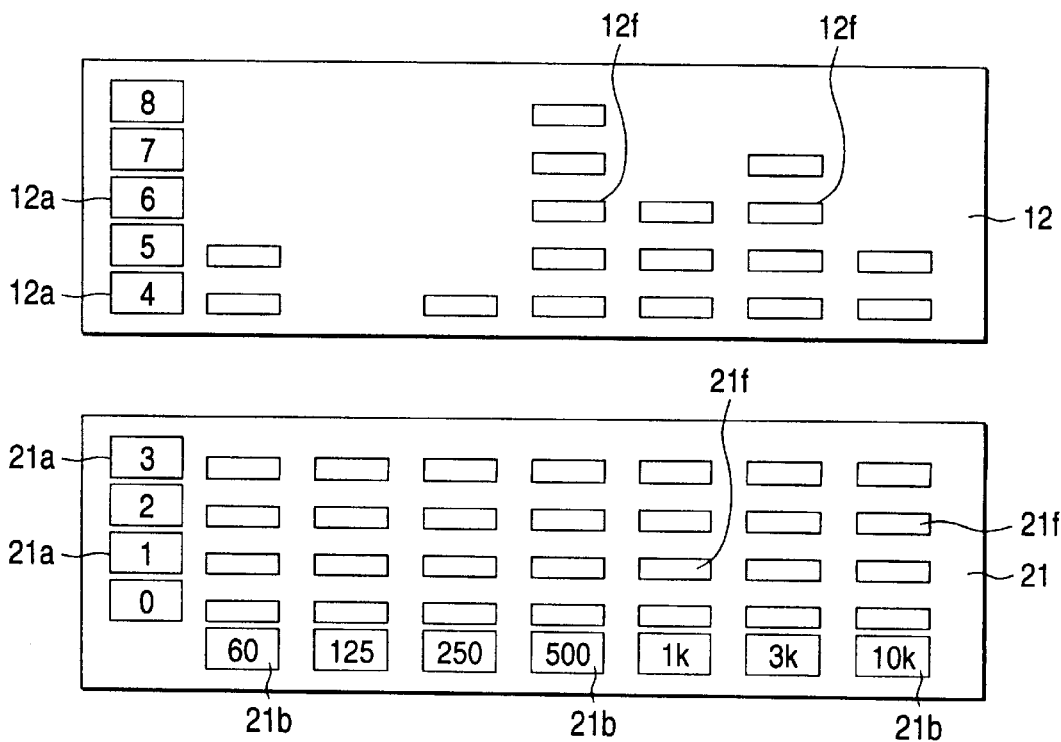
FIG. 3 is a diagram illustrating a display mode of making interlocking displays in center and slave display units.
Figure 4:
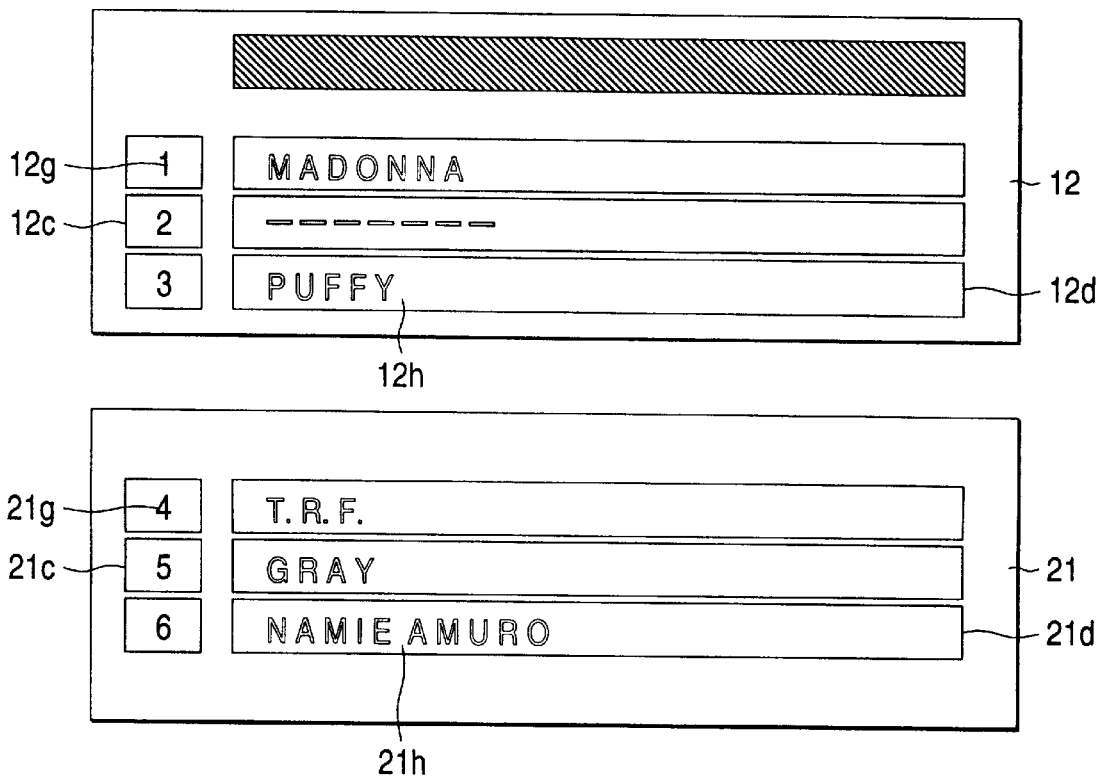
FIG. 4 is a diagram illustrating a display mode of making list displays in the center and slave display units.

FIG. 3 a diagram illustrating a display mode of making interlocking displays in the center and slave display units 12, 21; FIG. 4, a diagram illustrating a display mode of making list displays in the center and slave display units 12, 21; and FIG. 5, a diagram illustrating a display mode of making operation assisting displays in the center and slave display units 12, 21.

The interlocking display shown in FIG. 3 is intended for using two of the upper center display unit 12 and the lower slave display unit 21 as though one display unit by utilizing the respective display areas of these two display units; namely, the interlocking display is usable for the space display made by the equalizer unit 30.

The list display shown in FIG. 4 is usable for displaying a list of title names of disks contained in, for example, the CD changer unit 40 and the MD changer unit 50 by utilizing the respective display areas of these center and slave display units 12, 21.

Figure 5:
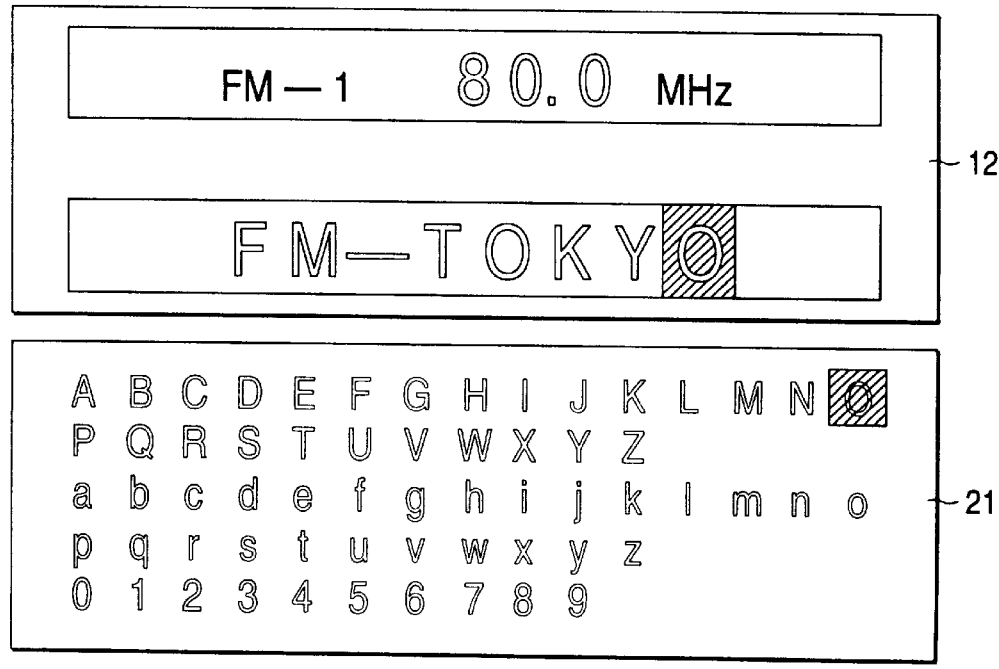
FIG. 5 is a diagram illustrating a display mode of making operation assisting displays in the center and slave display units.

The operation assisting display shown in FIG. 5 is usable for assisting the operating function by not performing the operation while switching screens as before but displaying a title input image being displayed in the lower slave display unit 21 when a title name is given to a frequency being received during the time the center unit 10 h as selected an FM radio mode, for example, by utilizing the respective display areas of these c enter and slave display units 12, 21.

At the time the interlocking display is made, the center control microcomputer 15 prepares a request message as a display message corresponding to the predetermined operation detected through the key operating unit 14.

As shown in FIG. 8, the request message has a first identification code and a image code. The first identification code is a code indicating the kind of a linking display; for example, the interlocking display, the list display or the operation assisting display. The image code is a code indicating each mode image, for example, a regular image including a space display, a playback time display, a title display and the like. Incidentally, a table for storing the image code and data relevant to the regular image corresponding to the image code is stored both in the center control microcomputer 15 of the center unit 10 and the slave control microcomputer 24 of the slave unit 20.

In the case of the spectrum analyzer display as shown in FIG. 3, the regular images correspond to places 12a, 21a in terms of a level value and places 21b in terms of a frequency band value. In the case of the title display shown in FIG. 4, the regular images are equivalent to a title No., places 12c, 21c of frames and places 12d, 21d of title name frames.

The center control microcomputer 15 of the center unit 10 and the slave control microcomputer 24 of the slave unit 20 receive variable display data obtainable via the communication line 60 and a combination of a second identification code and variable image data as the variable display data is sequentially sent out as shown in FIG. 9.

The second identification code is a code indicating the kind of the variable image data, which is equivalent to data indicating an operation and a condition concerning an individual connection unit.

Further, the variable image data corresponds to places 12f, 21f of level indicators when the space displays shown in FIG. 3, for example, are made and places 12g, 21g of title No. and places 12h, 21h of title names correspond to title displays shown in FIG. 4.

Figure 6:
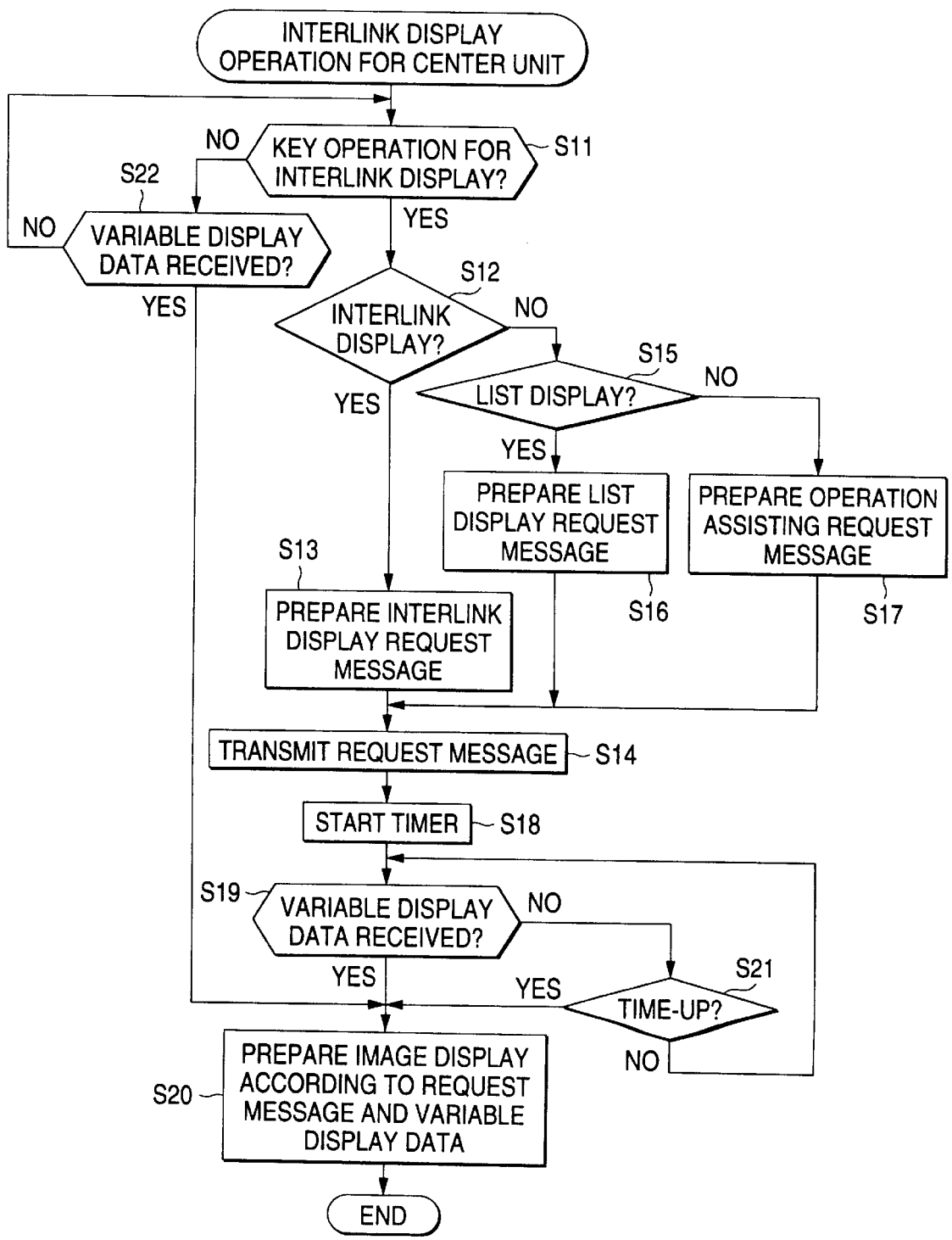
FIG. 6 is a flowchart showing the operation of the center control microcomputer in a center linking display process in this mode of the invention.

A description will subsequently be given of the operation of the interlocking display function between the center unit 10 and the slave unit 20 in the car audio system in this mode for carrying out the invention. FIG. 6 is a flowchart showing the operation of the center control microcomputer 15 in the center linking display process performed by the center unit 10 in this mode of the invention; and FIG. 7, a flowchart showing the operation of the slave control microcomputer 24 in the slave linking display process performed by the center unit 20 in this mode of the invention.

The center linking display process shown in FIG. 6 is a process to be performed by the center control microcomputer 15 for making the linking display such as the interlocking display, the list display or the operation assisting display to the center display unit 12 and the slave display unit 21 in accordance with the predetermined operation.

In FIG. 6, the center control microcomputer 15 decides whether or not the key operation has been performed by the key operating unit 14 in connection with starting the linking display (Step S11). If the key operation has been performed, the center control microcomputer 15 decides whether or not the interlocking display shown in FIG. 3 is selected through the key operation (Step S12).

If the interlocking display is selected through the key operation, the center control microcomputer 15 prepares a interlocking display request message (Step S13) and transmits the request message to the slave unit 20 via the communication line 60 (Step S14).

Unless the interlocking display is selected through the key operation at Step S12, the center control microcomputer 15 decides whether or not the list display shown in FIG. 4 is selected through the key operation (Step S15). If the list display is selected through the key operation, the center control microcomputer 15 prepares a list display request message (Step S16) and moves to Step S14.

Unless the list display is selected through the key operation at Step S15, the center control microcomputer 15 determines that the operation assisting display shown in FIG. 5 is selected, prepares an operation assisting display request message (Step S17) and moves to Step S14.

After transmitting the request message to the slave unit 20 at Step S14, the center control microcomputer 15 starts a timer for use in waiting to receive the variable display data from the connection unit such as the equalizer unit 30, the CD changer unit 40, the MD changer unit 50 or the like and the center unit 10 (Step S18) and decides whether or not the variable display data has been received from the connection unit via the communication line 60 (Step S19).

When the variable display data is received from the connection unit at Step S19, the center control microcomputer 15 prepares image data to be displayed in the center display unit 12 according to the request message and/or the variable display data prepared at Step S13, Step S16 or Step S17, makes an image display in the center display unit 12 according to this image data (Step S20) and terminates the center linking display process.

At Step S20, the center control microcomputer 15 identifies the kind of the linking display according to the first identification code contained in the request message prepared at Step S13, Step S16 or Step S17, reads the regular image data corresponding to the image code and makes an image display in the center display unit 12 while displaying the regular image thus identified by linking the image with the slave display unit 21. Furthermore, the center control microcomputer 15 identifies the variable image data according to the second identification code and makes the image display in the center display unit 12 where the regular image is being displayed while linking the variable image with the slave display unit 21 according to the variable image data.

Unless the variable display data has been received at Step S19, the center control microcomputer 15 decides whether or not time is up in the timer started at Step S18 (Step S21).

If time is up at Step S21, Step S20 is followed. Unless time is up Step S21, Step S19 is followed.

Unless the key operation relevant to the linking display has been performed at Step S11, the center control microcomputer 15 decides whether or not the variable display data has been received from the connection unit and the center unit 10 (Step S22). If the variable display data has been received then, Step S20 is followed.

Unless the variable display data has been received Step S22, Step 11 is followed again.

A description will subsequently be given of the slave linking display process shown in FIG. 7.

Figure 7:
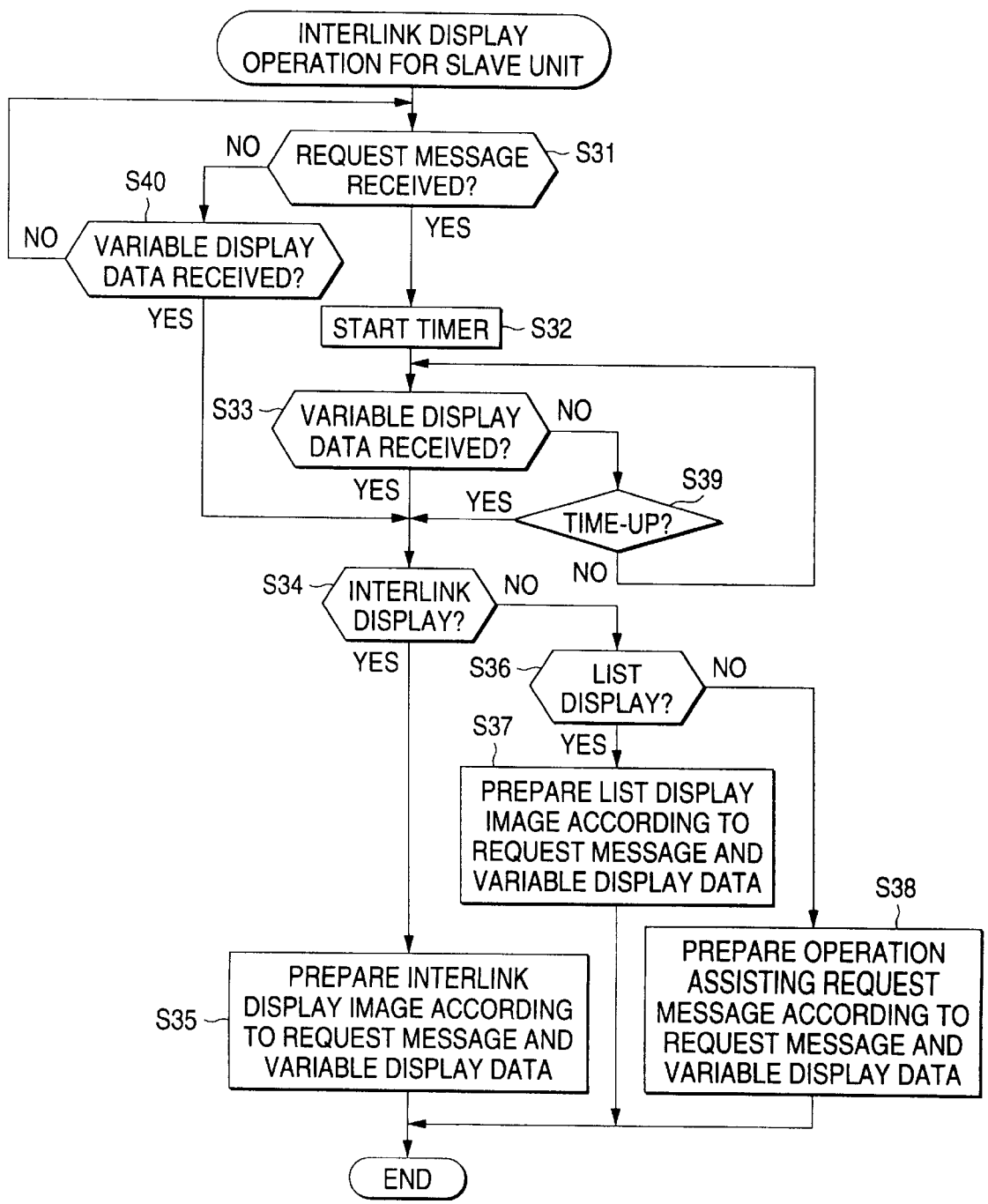
FIG. 7 is a flowchart showing the operation of the slave control microcomputer 24 in the slave linking display process in this mode of the invention.

The slave linking display process shown in FIG. 7 is a process to be performed by the slave control microcomputer 24 for making the linking display such as the interlocking display, the list display or the operation assisting display in the center display unit 12 and the slave display unit 21.

The slave control microcomputer 24 shown in FIG. 7 decides whether or not the request message transmitted at Step S14 as shown in FIG. 6 has been received via the communication line (Step S31). If the request message has been received, the slave control microcomputer 24 starts a timer for use in waiting to receive the variable display data from the connection unit and center unit 10 (Step S32) and decides whether or not the variable display data has been received from the connection unit and the center unit 10 (Step S33).

If the variable display data has been received from the connection unit and the center unit 10, the slave control microcomputer 24 decides whether or not the request message thus received is a massage relevant to the interlocking display shown in FIG. 3.

If the request message is a message relevant to the interlocking display, the slave control microcomputer 24 prepares interlocking display image data to be displayed in the slave display unit 21 according to the request message and the variable display data, causes an interlocking display image to be displayed in the slave display unit 21 according to the interlocking display image data (Step S35) and terminates the operation of the slave linking display process.

At Step S35, the slave control microcomputer 24 identifies the interlocking display according to the first identification code contained in the request message, reads the regular image data corresponding to the image code, makes the regular image display in the slave display unit 21 while making the display linked with the center display unit 12 and makes the variable image based on the variable image data included in the variable display data thus received in the slave display unit 21 where the regular image is being displayed. In other words, the interlocking display image as shown in FIG. 3 is displayed in the center display unit 12 and the slave display unit 21 through the process at Step S35. In the case of the space display of FIG. 3, however, variable display data is to be obtained from the equalizer unit 30.

Unless the request message is a message relevant to the interlocking display at Step S34, moreover, the slave control microcomputer 24 decides whether or not the request message is a message relevant to the list display (Step S36).

If the request message is a message relevant to the list display, the slave control microcomputer 24 prepares list display image data to be displayed in the slave display unit 21 according to the request message and the variable display data, causes a list display image in the slave display unit 21 according to the list display image data (Step S37) and terminates the operation of the slave linking display process.

At Step S37, the slave control microcomputer 24 identifies the list display according to the first identification code contained in the request message, reads the regular image data corresponding to the image code, makes the regular image display in the slave display unit 21 while making the display linked with the center display unit 12 and makes the variable image based on the variable image data included in the variable display data thus received in the slave display unit 21 where the regular image is being displayed. In other words, the list display image as shown in FIG. 4 is displayed in the center display unit 12 and the slave display unit 21 through the process at Step S37. In the case of the CD title display of FIG. 4, however, variable display data is to be obtained from the CD changer unit 40.

If the request message is a message relevant to the list display at Step S36, the slave control microcomputer 24 decides the request message to be a message relevant to the operation assisting display, prepares operation assisting display image data to be displayed in the slave display unit 21 according to the request message and variable display data, causes a operation assisting display image to be displayed in the slave display unit 21 according to the operation assisting display image data (Step S38) and terminates the operation of the slave linking display process.

At Step S38, the slave control microcomputer 24 identifies the operation assisting display according to the first identification code contained in the request message, reads the regular image data corresponding to the image code, makes the regular image display in the slave display unit 21 while making the display linked with the center display unit 12 and makes the variable image based on the variable image data included in the variable display data thus received in the slave display unit 21 where the regular image is being displayed. In other words, the operation assisting display image as shown in FIG. 5 is displayed in the center display unit 12 and the slave display unit 21 through the process at Step S37. In the case of the FM station title display of FIG. 5, however, variable display data is to be obtained from the center unit 10.

Unless the variable display data has been received from the center unit 10 or the connection unit at Step S33, the slave control microcomputer 24 decides whether or not time is up in the timer started at Step S32 (Step S39).

If time is up in the timer started at Step S32, Step S34 is followed. Unless time is up Step S39, Step S33 is followed.

Unless the request message has been received at Step S31, moreover, the slave control microcomputer 24 decides whether or not the variable display data has been received (Step S40). If the variable display data has been received, Step S34 is followed.

If the variable display data has been received at Step S40, Step S31 is followed.

In this mode of the invention, the center control microcomputer 15 transmits request message to the slave control microcomputer 24 in accordance with the linking display operation performed by the key operating unit 14 of the center unit 10 and since these center and slave control microcomputers are used to control the center display unit 12 and the slave display unit 21 respectively according the request message and the variable display data from the connection unit or the center unit 10, these center and slave display units 12, 21 perform the operation of the linking display such as the interlocking display, the list display or the operation assisting display as if they are one display unit, whereby it is possible to not only improve expressive power of a display such as the interlocking display, the list display, operation assisting display or the like but also assist the simplification of the operation in the operation assisting display.

In the display device thus arranged as set forth above according to the present invention, the first display unit of the center unit and the second display unit of the slave unit are used to perform the operation of the linking display such as the interlocking display, the list display and the operation assisting display as if they perform the operation as one display unit in accordance with the predetermined operation, whereby it is possible to not only improve expressive power of a display like the interlocking display, the list display, the operation assisting display or the like but also assist the simplification of the operation in the operation assisting display.

What is claimed is:

1. A display device for an audio system including a radio tuner, comprising:

a center unit having a first display unit;

a slave unit having a second display unit; and a communication line for communicatively connecting the center unit and the slave unit;

said center unit comprising;

display message transmitting means for preparing a display message containing regular image data indicating a form of displaying the linkage between the display images of the first display and second display units corresponding to a predetermined operation on detecting the predetermined operation and for transmitting the display message to the slave unit;

center variable display detection means for detecting variable display data including variable image data indicating an operating condition from the communication line; and center control means for displaying a regular image linked with the second display unit in the first display unit according to the regular image data contained in the display message when the display message is transmitted by the display message transmitting means and simultaneously causing the regular image together with a variable image linked with the second display unit to be displayed in the first display unit according to the variable image data included in the variable display data and the regular image data when the variable display data is detected by the center variable display detection means, and said slave unit comprising:

display message receiving means for receiving the display message from the center unit;

slave variable display detection means for detecting the variable display data including the variable image data indicating the operating condition from the communication line; and slave control means for displaying the regular image linked with the first display unit in the second display unit according to the regular image data contained in the display message when the display message is received by the display message receiving means and simultaneously causing the regular image together with the variable image linked with the first display unit to be displayed in the second display unit according to the variable image data included in the variable display data and the regular image data when the variable display data is detected by the slave variable display detection means.

2. A display device as claimed in claim 1, wherein said center unit further includes a first operating means, a radio tuner, and a main microcomputer for controlling said first display unit and said radio tuner, and for executing each operation according to operation of the first operating means, said slave unit further includes a second operating means, a and a slave microcomputer for controlling said second display, and for executing each operation according to operation of the second operating means, and wherein said main microcomputer and said slave microcomputer are connected by said communication line.

3. A display device for an audio system having a radio tuner, comprising:

a main device having a first display unit;

a sub-device connected with said main device and having a second display unit; and a communication line for communicatively connecting said main device and said sub-device, wherein said main device comprises:

message data generating means which monitors a predetermined key operation, upon acknowledging the predetermined key operation, generates a first identification code responsive to a static image corresponding to the key operation and display image data representing a type of image, and transmits the message data to said sub-device;

first display execution means which monitors a second identification code with dynamic image data corresponding to a dynamic image to be output to said communication line, generates display image on the basis of said dynamic image data and the display image information corresponding to the key, and outputs display data to said first display unit;

wherein said sub-device comprises:

second display execution means which monitors the message data output into the communication line and said second identification code with dynamic image data corresponding to a dynamic image, generates a display image in response to these information, and outputs a display image data to the second display unit.

4. A display device as claimed in claim 3, wherein said message data generation means comprises a main device control microcomputer for controlling whole operation of the main device, and said first display execution means comprises a main display microcomputer for controlling said first display unit.

5. A display device as claimed in claim 3, wherein said second display execution means comprises a sub-device display control microcomputer for controlling whole operation of the sub-device, and a sub-device display microcomputer for controlling the second display unit.

6. A display device as claimed in claim 3, wherein said communication line is connected to the other external equipments.

7. A display device as claimed in claim 3, wherein a spectrum analyzer indication is displayed on said first and second display units.

8. A display device as claimed in claim 3, wherein a list of title name of disks contained in a disk player is displayed on said first and second display units.

9. A display device as claimed in claim 3, wherein one of first and second display units are used to assist key input operation.

10. A display device as claimed in claim 3, wherein said message data consists of said first identification code representing kind of a linking display and said display image data.

11. A display device as claimed in claim 3, wherein said second identification code and dynamic image data corresponding to a dynamic image are sequentially sent out as a combination.

* * * * *